July 18, 1967 C. R. RUFFING 3,331,718

METHOD OF REMOVING A SELECTED PORTION OF AN AROMATIC POLYAMIDE-IMIDE INSULATING FILM TO EXPOSE THE SURFACE OF AN ELECTRICAL CONDUCTOR

Filed March 16, 1964

WITNESSES:

Bernard R. Gieguez

James F. Young

INVENTOR

Charles R. Ruffing

BY Alex Mich Jr.

ATTORNEY

United States Patent Office 3,331,718
Patented July 18, 1967

3,331,718

METHOD OF REMOVING A SELECTED PORTION OF AN AROMATIC POLYAMIDE-IMIDE INSULATING FILM TO EXPOSE THE SURFACE OF AN ELECTRICAL CONDUCTOR

Charles R. Ruffing, Churchill Boro, Pa., assignor, by mesne assignments, to Rogers Corporation, a corporation of Massachusetts Filed Mar. 16, 1964, Ser. No. 352,155
8 Claims. (Cl. 156—3)

Figure 1:
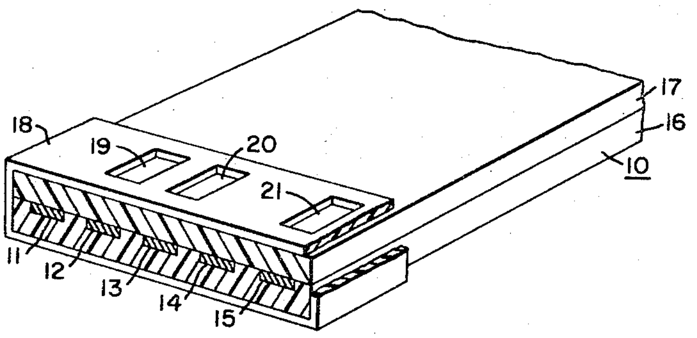

This invention relates to methods of removing selected areas of resinous insulating films in order to expose conductor contact surfaces. More particularly this invention relates to removing selected areas of aromatic polyimide films in order to provide one or more conductor contact surfaces on flexible or solid multiple conductor electrical members.

Flexible multiple conductor flat wiring members, particularly flat cables with a plurality of parallel metal foil conductors, represent an effort to simplify the problems encountered in wiring complex circuits and systems. Flat cables, for example, have been fabricated by sandwiching precisely spaced flat metal strips between an upper and lower thermoplastic insulating film. An adhesive is frequently employed between the insulating films to bond the conductors and insulation together and form a unitary sandwich or laminate. In order to terminate such conductors, the insulating film must be removed so that the conductor surfaces are exposed.

The thermoplastic films have been removed by melt techniques in which local areas of the film are heated sufficiently to either liquify or make portions of the film very soft so that the film can be removed. These techniques have not been reliable because they frequently fail to yield completely clean contact surfaces. Thermoplastic films with low softening or distortion points are the most easily removed by this technique but such thermoplastic insulating films then severely limit the service or environmental conditions in which the cables may be employed, in addition to limiting the techniques and materials for forming end connectors integral with the flat cable.

Abrasion techniques, for example mechanically cutting, grinding or scraping, have also been employed to remove the insulating films in selected areas, particularly with resinous films not adapted for removal by melt techniques. The insulating films and the flat conductors, usually copper foil, are very thin. The conductors are fragile and the abrading techniques can easily damage the conductor, requiring an entire cable assembly to be discarded.

Accordingly, it is the general object of this invention to provide a new and improved method for exposing insulated conductor contact surfaces conveniently and with a high degree of reliability.

Another object of this invention is to provide new and improved methods of removing selected portions of insulating films in order to expose contact surfaces on fragile conductors reliably and without the danger of damaging the conductors.

Yet another object of this invention is to provide new and improved methods of rapidly removing insulating films of aromatic polyimide resins to expose conductors insulated with such films.

Briefly, the present invention accomplishes the cited objects by contacting only selected areas of insulating film with a chemical reagent which will remove or dissolve the film in the selected area without damaging the conductor itself or other unselected portions of insulating film. Insulating films of aromatic polyimide resins are removed by contacting selected portions with caustic solutions. Unselected portions may be masked so that contact with the caustic solution is avoided or, where the selected portion is appropriately located, only the selected portion may be immersed in or contacted by the solution.

Further objects and advantages of the invention will become apparent as the following description proceeds and features of novelty which characterize the invention will be pointed out in particularity in the claims annexed to and forming a part of this specification.

Figure 2:
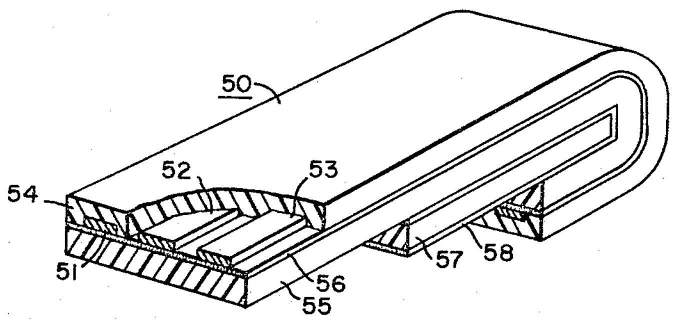

For a better understanding of the invention reference may be had to the accompanying drawing, in which:

FIGURE 1 is a partially sectioned perspective view of a flat multiple conductor cable with a suitable mask in place for selectively removing insulation and exposing conductor surfaces in accordance with this invention, and FIG. 2 is a partially sectioned perspective view of a flat multiple conductor cable wrapped about an insulating block which may be partially immersed in a chemical solution to remove a portion of the insulating film and expose conductor surfaces in accordance with this invention.

Electrical members having a plurality of spaced thin metallic foil conductors supported and insulated by films of aromatic polyimide or aromatic polyamide-imide resins are described and copending application Ser. No. 352,163, filed Mar. 16, 1964, assigned to the assignee of this invention. Methods for preparing such electrical members are described in the above cited application and copending application Ser. No. 352,154, filed Mar. 16, 1964, also assigned to the assignee of this invention. The properties of these insulating films permit the electrical members to be employed for prolonged periods in relatively severe environmental or service conditions. The films have excellent thermal stability, high electric strength, are tough, flexible infusible and resistant to all known solvents and most chemical agents.

These aromatic polyimide resins have the recurring unit:

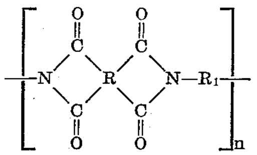

wherein $n$ is at least 15 and R is at least one tetravalent organic radical selected from the group consisting of:

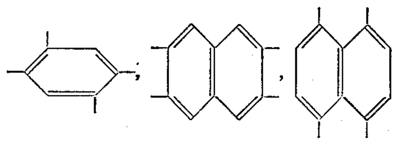

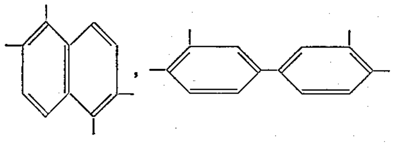

and

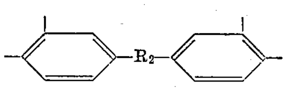

$R_2$ being selected from the group consisting of divalent aliphatic hydrocarbon radicals having from 1 to 4 carbon atoms and carbonyl, oxygen, sulfur and sulfonyl radicals and in which $R_1$ is at least one divalent radical selected from the group consisting of:

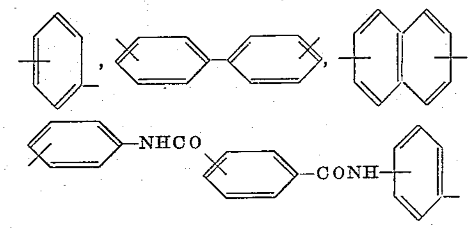

and

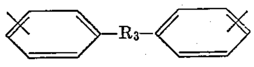

in which $R_3$ is a divalent organic radical selected from the group consisting of $R_2$, silicon and amido radicals. Polymers containing two or more of the R and/or $R_1$ radicals, especially multiple series of $R_1$ containing amido radicals, are particularly valuable in some instances.

The aromatic polyimide resins represented by certain of the foregoing formulae are described in British Patent 903,271 and reference may be made thereto for details on the method of preparing the resins. The aromatic amide modified polyimide resins, known herein as aromatic polyamide-imide resins and represented by certain of the foregoing formulae, are described and claimed in U.S. application Ser. No. 295,279, now Patent No. 3,179,635, assigned to the assignee of this invention, and reference may be made thereto for details on the methods of preparing those resins. Reference may also be made to an article by Frost and Bower, entitled "Aromatic Polyimides" in J. Polymer Science, Part A, vol. 1, pp. 3135–3150 (1963). For convenience, the resins will hereinafter be referred to as aromatic polyimides or aromatic polyamide-imides. It will be apparent to those skilled in the art that the polyamide-imide resins are those in which $R_3$ is an amido radical or, more generally, a finite series of aromatic groups linked by amido radicals in addition to the imide linkage.

It has now been discovered that selected areas of the described aromatic polyimide films may be removed by masking the unselected portions and exposing the selected portions to strong caustic solutions. Referring now to FIG. 1, there is illustrated a flat multiple conductor cable 10 having a plurality of thin flat copper foil conductors 11, 12, 13, 14 and 15 insulated and supported by an aromatic polyimide film 16 and a second resinous film 17 which may be an aromatic polyimide film or a film of other resinous materials, as for example, films of polyester, polyethylene, polyvinyl chloride, polyvinylidene chloride, polyvinylidene fluoride, polycarbonate, polytetrafluoroethylene or polychlorotrifluoroethylene resins. The film 16 is in direct contact with at least one of the broad surfaces of the spaced copper foil conductors. The films 16, 17 are each about 1.5 mils thick and the conductors 11, 12, 13, 14 and 15 are each about 1 mil thick. A mask 18, made from 1/16" thick polytetrafluoroethylene with holes 19, 20 and 21, is clamped (not illustrated) to the cable so that the holes are located over the conductors 12, 13 and 15. The masked cable is immersed in a hot (95° C.) solution of 20% sodium hydroxide for approximately 10 minutes, removed and washed in cold water. The insulating film outlined by the openings in the mask is removed and the conductor surfaces located therebeneath are exposed. The fragile conductors are not damaged by the operation and the masked surfaces of the insulating film are unaffected by the caustic solution. It is apparent that selected portions of the insulating film have been removed and that the unselected portions remain unaffected by the operation.

Referring now to FIG. 2, there is illustrated a flexible electrically conductive member 50, comprising copper foil conductors 51, 52 and 53 sandwiched between a film 54 of an aromatic polyamide-imide resin and a polyester film 55, for example a film of polyethylene terephthalate, bonded together by an adhesive layer 56, of a phenolic nitrile resinous binder. The film 55 is in direct contact with surfaces of the copper foil conductors. The films and the conductors are approximately 1 mil thick. The member 50 is bonded to an insulating block 57, a 1/16" thick epoxy glass laminate by an epoxy resin adhesive 58. The surface of the aromatic polyamide-imide film is exposed. The assembly is immersed in a hot 20% aqueous solution of sodium hydroxide for 10 minutes, the assembly extending into the solution so that at least a portion of the block 57 is not immersed. The assembly is removed and washed carefully in cold water. The selected portion of the film 54, i.e. that portion contacted by the solution, will be removed with no damage to the conductors or other portions of the insulating films.

The time required for removal of the insulating film will depend on the thickness of the film, the concentration of the caustic solution and the temperature of the caustic solution. The specific type of aromatic polyimide or aromatic polyamide-imide resin will, in general, have a limited effect on the rate of removal. Some difference in susceptibility to attack by the caustic solution will be noted with different specific polyimide resins. However, the polyamide-imide resins formed by the reaction of pyromellitic dianhydride (PMDA) and a diaminobenzanilide exhibit a solubility rate in caustic solution in the order of 20 times that of the other aromatic polyimide or aromatic polyamide-imide resins. This is far in excess of the normal differences among the other polymers examined. For this reason, the aromatic polyamide-imide resins derived from pyromellitic dianhydride and diaminobenzanilide are preferred as the insulating film. When one of the insulating films is a film of a resin other than the described aromatic polyimide or aromatic polyamide-imide resins, and an adhesive layer is employed between the two films to form a sandwich, the aromatic polyamide or aromatic polyamide-imide film should be in direct contact with the surface of the conductor. Some adhesives are not susceptible to attack by the caustic solution and would interfere with the rapid and reliable exposure of conductor surfaces if located between the polyimide film and the conductor surfaces.

It is to be understood that the term "dissolve" is intended to cover the mechanism involved in the removal of the aromatic polyimide and aromatic polyamide-imide resinous films even though the mechanism may not actually be one in which these polymers, as such, pass into solution. The term "dissolve" is employed in its broadest sense of "destruction" or "disintegration" irrespective of the actual mechanism involved. While we do not wish to be held to any particular principle of operation, it has been theorized that the caustic solution causes the imide linkages to hydrolyze and form a salt of the phthalmic acid formed by the opening of the imide ring. These salts are water soluble and can be easily removed by rinsing or washing with water. It should be noted, however, that the greater solubility rate of the aromatic polyamide-imide derived from pyromellitic dianhydride and a diaminobenzanilide is not entirely consistent with this theory and it is apparent that other factors are operative.

Any substance that gives a high concentration of hydroxyl ions when dissolved in water, i.e. any strong base, does remove the described film and such aqueous solutions should be understood to be within the scope of the term strong caustic solution. In addition to sodium hydroxide, aqueous solutions of potassium and other alkali metal hydroxides and ammonium hydroxide or combinations thereof may be employed with satisfactory results. The film removal is a time, temperature and concentration phenomenon and for the economies and practicability of speed, concentrations above about 10% and temperatures above room temperature, i.e. above about 70°

F. are preferred. Also because of the rate of removal, solutions of sodium hydroxide are preferred.

While a polytetrafluoroethylene mask has been described above in connection with FIG. 1, it is to be understood that other masking materials, so long as they are essentially unaffected by or are inert to the caustic solution, may be employed. The masking material may for example be polyvinyl chloride, rubbers such as neoprene, butyl and the like, a petroleum wax deposited in a pattern, over the member, with patterned openings or perforations only over certain conductors. Photosensitive materials may be employed to provide mask patterns in accordance with principles known in the printed circuit art. Other techniques and materials common to printed circuit practice may also be employed. Integral molded connectors may be provided with suitable openings for the chemical removal of the insulating film in accordance with the techniques described by Travis in copending application Ser. No. 352,156, filed Mar. 16, 1964, assigned to the assignee of this invention.

The heretofore described techniques may be employed with electrical members having conductors of metals other than copper, as for example copper alloys, aluminum and its alloys, nickel and its alloys and the like, so long as the metal is not adversely affected by short term exposure to the chemical etchant. The described techniques may be employed to remove selected portions or areas of other resinous insulating films with chemical etchants or reagents other than the caustic solutions described. For example, films of polyvinyl alcohol may be removed by hot water, cellulose nitrate may be removed by acetone and nylon may be removed by dilute phenol. The polytetrafluoroethylene mask is suitable for use with any of these chemical reagents as are masks provided by printed circuit techniques.

While there have been shown and described what are at present considered to the preferred embodiments of the invention, modifications thereto will readily occur to those skilled in the art. It is not desired, therefore, that the invention be limited to the specific arrangements shown and described and it is intended to cover in the appended claims all such modifications as fall within the true spirit and scope of the invention.

I claim as my invention:

1. A method of removing a selected portion of a cured infusible aromatic polyamide-imide insulating film to expose the surface of an electrical conductor therebeneath comprising the steps of masking unselected portions of the insulating film to provide an exposed selected portion of insulating film, and contacting the exposed portion with an aqueous strong caustic solution to dissolve only that portion of the insulating film.

2. A method of exposing a selected portion of a metallic electrical conductor covered with a cured infusible aromatic polyamide-imide insulating film comprising the steps of covering the insulating film with an inert masking member having an opening therethrough so that said opening is located over the selected portion of insulating film and conductor, contacting the opening with an aqueous strong caustic solution which will dissolve the insulating film, maintaining such contact for a sufficient time to remove the film outlined by the opening and removing said solution containing the dissolved film from the opening.

3. A method of removing selected portions of a film of a cured infusible aromatic polyamide-imide resin in direct contact with a metallic electrical conductor comprising the steps of contacting only the selected portions with an aqueous strong caustic solution for a sufficient time to dissolve the film and thereafter removing the solution containing the dissolved film whereby a portion of said electrical conductor is exposed.

4. The method of claim 3 in which the resin has the recurring unit

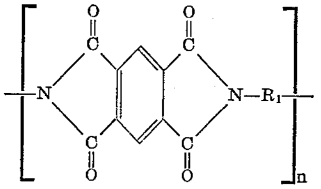

wherein $n$ is at least 15 and $R_1$ is a benzanilido radical.

5. The method of claim 3 in which said aqueous strong caustic solution contains at least about 10% of sodium hydroxide, by weight.

6. A method of removing a selected area of a cured infusible aromatic polyamide-imide insulating film in direct contact with at least one surface of a metallic conductor to expose the conductor contact surface beneath said selected area of film comprising the steps of covering the insulating film with a masking material which will prevent liquid contact with said film, the masking material having a patterned perforation located over said selected area, contacting at least said selected area with an aqueous strong caustic solution for a sufficient time to dissolve the film and thereafter rinsing away the caustic solution, thereby removing the selected area of film and exposing the conductor surface therebeneath.

7. The method of claim 6 in which the insulating film is composed of a resin having the recurring unit

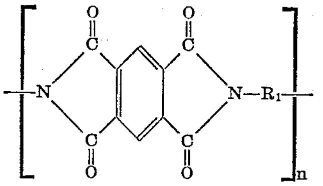

wherein $n$ is at least 15 and $R_1$ is a benzanilido radical.

8. The method of claim 6 in which the aqueous strong caustic solution is sodium hydroxide.

References Cited

UNITED STATES PATENTS

| | | | |
|---|---|---|---|
| 2,563,417 | 8/1951 | Pessel. | |
| 2,694,658 | 11/1954 | Crepeau et al. | |
| 3,179,635 | 4/1965 | Frost et al. | 260—78 |
| 3,186,883 | 6/1965 | Frantzen | 156—7 |

JACOB H. STEINBERG, *Primary Examiner.*